United States Patent
Griffel et al.

(10) Patent No.: US 7,548,170 B1
(45) Date of Patent: Jun. 16, 2009

(54) REAR DOOR HEAT EXCHANGER INSTRUMENTATION FOR HEAT QUANTITY MEASUREMENT

(75) Inventors: Marc Griffel, Hildrizhausen (DE); Mark D. Lehmann, Weil im Schoenbuch (DE); Michael Schaefer, Pliezhausen (DE); Karl H. Uhl, Weil im Schonbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/133,046

(22) Filed: Jun. 4, 2008

(51) Int. Cl.
*G08B 21/00* (2006.01)

(52) U.S. Cl. .................. 340/605; 62/259.2; 361/687; 361/690; 454/184

(58) Field of Classification Search ......... 340/603–611, 340/635, 584–599; 361/687, 690–697; 454/184; 62/259.2
See application file for complete search history.

(56) References Cited

U.S. PATENT DOCUMENTS

| 5,533,347 | A | * | 7/1996 | Ott et al. ................. 62/115 |
| 6,041,851 | A | | 3/2000 | Diebel et al. |
| 6,196,003 | B1 | * | 3/2001 | Macias et al. ............... 62/3.7 |
| 6,354,093 | B2 | * | 3/2002 | Davis et al. ................. 62/89 |
| 6,798,660 | B2 | * | 9/2004 | Moss et al. ................ 361/699 |
| 7,365,973 | B2 | * | 4/2008 | Rasmussen et al. ........ 361/694 |
| 7,398,184 | B1 | * | 7/2008 | Chen ......................... 702/182 |
| 7,447,022 | B2 | * | 11/2008 | Murakami et al. .......... 361/695 |
| 2006/0161311 | A1 | | 7/2006 | Vinson et al. |

* cited by examiner

*Primary Examiner*—Eric M Blount
(74) *Attorney, Agent, or Firm*—Oppenheimer Wolff & Donnelly LLP

(57) ABSTRACT

A method for controlling operation of a heat exchanger system comprises providing a heat exchanger system mountable to a rear door of a rack mounted computer system, circulating a heat transport medium through the heat exchanger system, detecting leaks in the heat exchanger system by comparing a first flow rate in an inflow line to a second flow rate in a return flow line, emitting a leakage alert and ceasing further circulation of the heat transport medium through the heat exchanger system when the first flow rate exceeds the second flow rate by a predetermined flow amount, optimizing operation of the rack mounted computer system by monitoring an interior temperature of the rack mounted computer system in a plurality of vertical zones, and optimizing operation of the heat exchanger system by comparing a second temperature measured by a second temperature sensor in the return flow line with a predetermined maximum return flow temperature value.

1 Claim, 5 Drawing Sheets

REAR DOOR HEAT EXCHANGER INSTRUMENTATION FOR HEAT QUANTITY MEASUREMENT

FIELD OF THE INVENTION

The present invention relates in general to heat management, and more particularly, to a heat exchanger system and method for measuring and monitoring heat quantity in rack mounted computer systems.

BACKGROUND OF THE INVENTION

The increased power requirements of today's computer systems leads to a proportionately increased heat load. Generally speaking, the historically installed heating, ventilating, and air conditioning (HVAC) systems are not capable of keeping up with this growth. Rear door heat exchangers address this problem by cooling the air exhausted from rack mounted systems. These heat exchangers are primarily viewed as local cooling devices designed to treat particular hot spots. In particular, the heat exchangers absorb energy from the hot air flow from the computer system and transfer it into water. However, cooling of the air around the rack mounted system can also be viewed as a heating process from the point of view of the cooling cycle. This aspect becomes important if a site operates with combined cooling, heating, and power generation (trigeneration or "CCHP") where the energy from the return flow of the cooling cycle becomes part of a larger energy cycle with appropriate measurement and control requirements.

One drawback of existing rear door heat exchangers is the need for an external monitoring system to detect failures. These failures may include, for example, leakages and overheating of the equipment in the rack. Both events can cause serious damage to the equipment and environment, and therefore, must be detected as soon as possible. Because no human operator is present to guard against device failures in typical operating environments, these failures often go undetected for extended periods of time. Thus, although there is a need for remote "alerts" in case of failures, existing rear door heat exchanger systems do not provide such a feature.

Based on the foregoing, there exists a need for an improved system and method for measuring and monitoring heat quantity in rack mounted computer systems. There is also a need for an improved system and method for detecting failures and initiating an alert or other appropriate action in response to the detection of a failure.

BRIEF SUMMARY OF THE INVENTION

The present invention solves the foregoing problems by providing a method for controlling operation of a heat exchanger system comprising providing a heat exchanger system mountable to a rear door of a rack mounted computer system, circulating a heat transport medium through the heat exchanger system, detecting leaks in the heat exchanger system by comparing a first flow rate in an inflow line to a second flow rate in a return flow line, emitting a leakage alert and ceasing further circulation of the heat transport medium through the heat exchanger system when the first flow rate exceeds the second flow rate by a predetermined flow amount, optimizing operation of the rack mounted computer system by monitoring an interior temperature of the rack mounted computer system in a plurality of vertical zones, and optimizing operation of the heat exchanger system by comparing a second temperature measured by a second temperature sensor in the return flow line with a predetermined maximum return flow temperature value. Optimizing operation of the rack mounted computer system includes emitting a rack overheat alert and automatically increasing air flow through the heat exchanger system when the interior temperature in at least one of the vertical zones exceeds a maximum desirable interior temperature value, and automatically increasing a load level of the rack mounted computer system when the interior temperature in at least one of the vertical zones is less than a minimum desirable interior temperature value. Optimizing operation of the heat exchanger system includes automatically reducing flow of the heat transport medium through the heat exchanger and decreasing air flow from through the heat exchanger system when the second temperature is less than the predetermined maximum return flow temperature value, and automatically increasing flow of the heat transport medium through the heat exchanger and increasing air flow through the heat exchanger system when the second temperature is greater than or equal to the predetermined maximum return flow temperature value.

DETAILED DESCRIPTION OF THE INVENTION

The present invention will be described in detail with reference to the figures below. However, generally speaking, the present invention is a rear door heat exchanger system having built-in sensors and a microcontroller with a central operator panel and display configured to measure temperature differences between the inside and the outside of the rear door, heat transport medium temperature, and flow rate. The microcontroller may be designed to consolidate and archive the measured data. By mounting the operator panel and display to the outside of the door, the working state may be monitored easily and at one location. Benefits provided by the integration of such a control system include, but are not limited to: measuring, archiving, and displaying the heat capacity dissipation of the heat exchanger; measuring, archiving, and displaying the proper operation of the heat exchanger; alerting operating personnel of failures in the system, such as by using blinking lights, sound alerts, or remote alerting options including phone lines, computer networks, and the like; tapping the information provided from the instrumented rear door device and providing the information to the systems mounted within the rack; and providing the measured data to a central master control station.

The rear door heat exchanger system of the present invention functions by combining and integrating several sensors into the heat exchanger. The sensors are preferably mounted during the fabrication of the device, although the microcontroller could optionally be connected separately in order to allow for various controller implementations. However, the core idea is to integrate the sensors, controller, operator panel, and display into the door itself.

Figure 1:
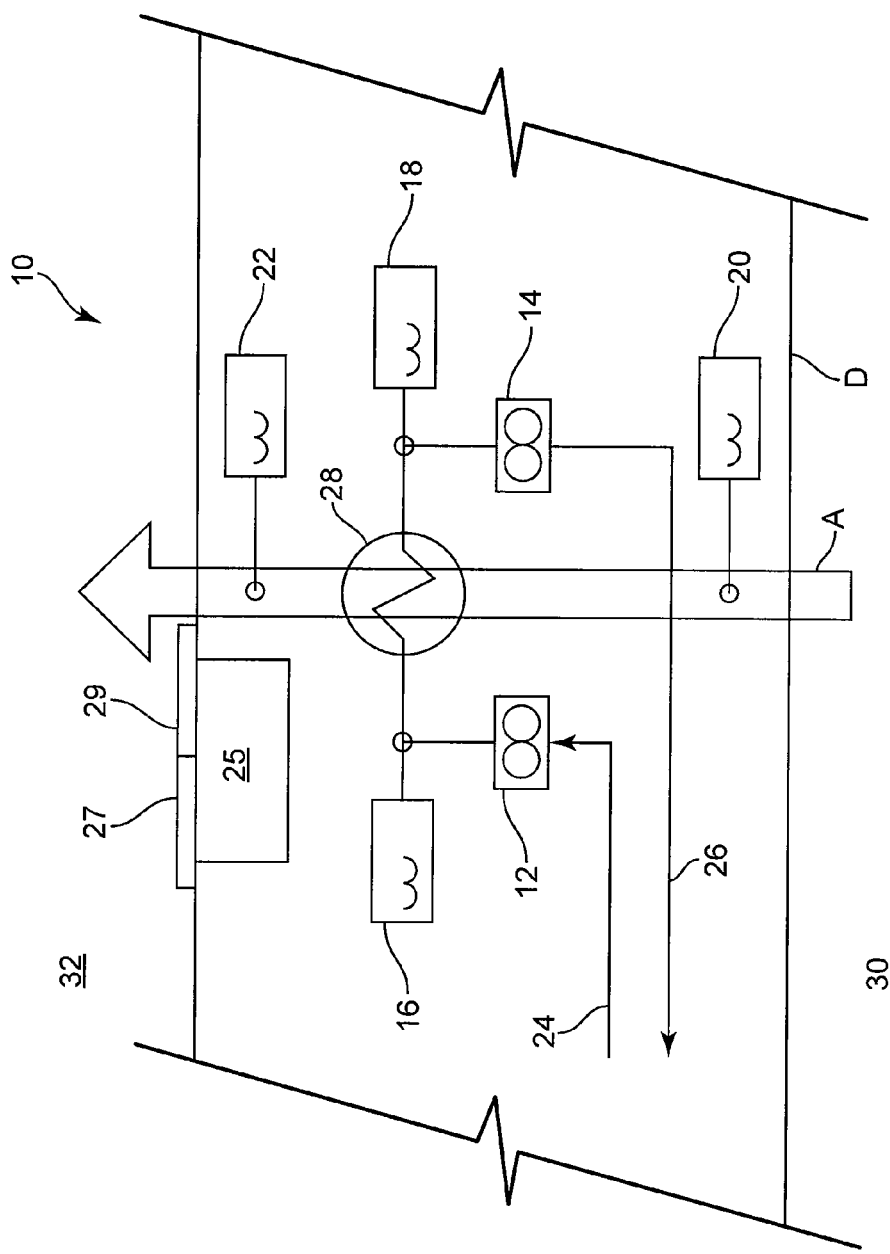
FIG. 1 is a schematic diagram illustrating the various components of a heat exchanger system in accordance with the present invention disposed within and/or coupled to a rear door of a rack mounted system.

FIG. 1 is a schematic diagram illustrating the various components of heat exchanger system 10 in accordance with the present invention disposed within and/or coupled to a rear door D of a rack mounted computer system. In particular, heat exchanger system 10 includes first flow meter 12, second flow meter 14, first thermometer or temperature sensor 16, second thermometer or temperature sensor 18, third thermometer or temperature sensor 20, fourth thermometer or temperature sensor 22, inflow line 24, return flow line 26, and heat exchanger 28 disposed between inflow line 24 and return flow line 26. Heat exchanger system 10 also includes microprocessor 25 having central operator panel 27 and display 29 mounted to door D.

First and second flow meters 12 and 14 are adapted to measure the flow rate of the heat transport medium. Although any suitable heat transport medium may be used, as will be appreciated by those skilled in the art, one exemplary medium is water. First thermometer 16 is adapted to measure the temperature of the heat transport medium in inflow line 24, while the temperature of the heat transport medium in return flow line 26 may be measured with second thermometer 18. As those skilled in the art will appreciate, the heat quantity delivered from the heat exchanger may be calculated based upon the flow rates measured with first and second flow meters 12 and 14 along with the temperature difference of the heat transport medium measured with first and second thermometers 16 and 18. The heat quantity calculation, along with numerous other data, may be processed with microprocessor 25.

Besides being adapted for obtaining heat capacity measurements, first and second temperature sensors 16 and 18 along inflow and return flow lines 24 and 26, respectively, allow for secure operation of the heat exchanger. Additionally, leakages may be detected using flow measurements gathered by first and second flow meters 12 and 14. A difference in the flow rates measured by first and second flow meters 12 and 14 may indicate a heat medium loss between these two measuring points.

Third thermometer 20 is adapted to measure the temperature of airflow A as it enters heat exchanger system 10, while fourth thermometer 22 is adapted to measure the temperature of airflow A as it exits heat exchanger system 10. In particular, overheating systems in the rack may be detected from rising temperature at the interior 30 of door D. Furthermore, the temperature difference between third and fourth thermometers 20 and 22 may indicate proper operation of heat exchanger 28. Although depicted with only a single sensor, air input and output temperature may be measured in several zones along the vertical direction of the rack. Experience shows that vertical temperature distribution varies for rack mounted computer systems, which would make it otherwise difficult to distinguish between a single overheating system or normal system operation in a rack. In one exemplary embodiment, three to four levels in the lower, mid, and upper area of the rear door may provide sufficiently accurate input.

Figure 2:
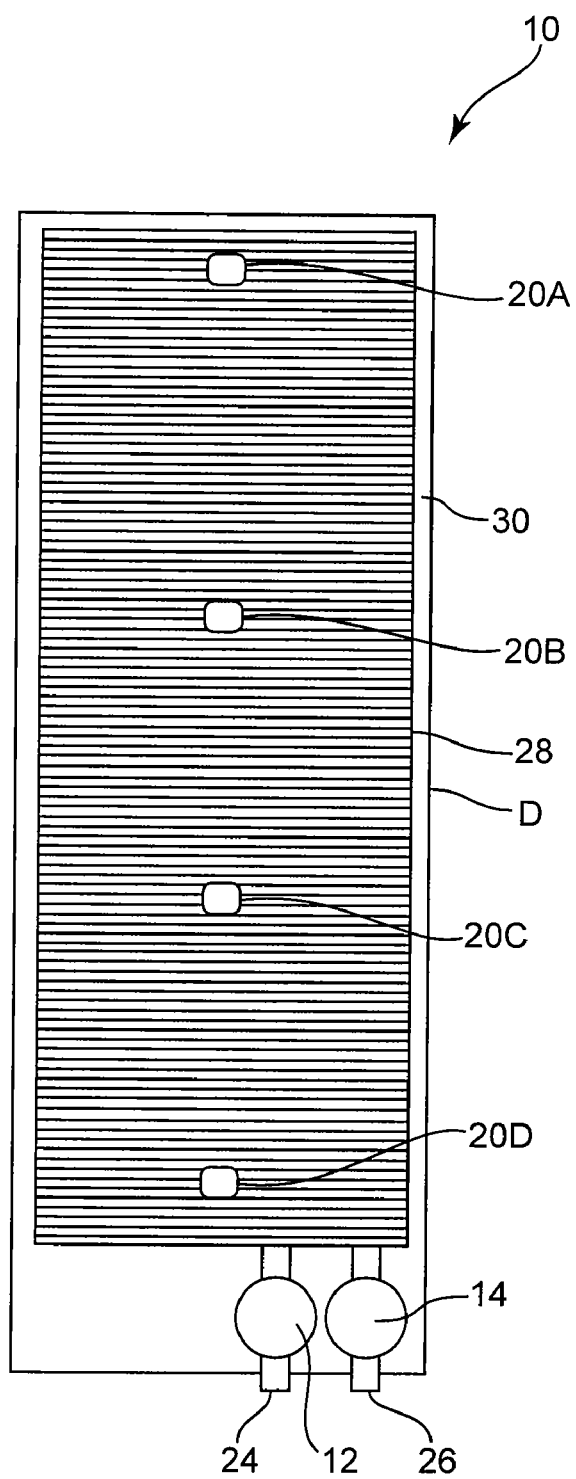
FIG. 2 is a diagram illustrating a portion of the heat exchanger system illustrated in FIG. 1 mounted to an interior surface of the door.

FIG. 2 is a diagram illustrating heat exchanger system 10 mounted to door D. As shown in FIG. 2, heat exchanger 28 may occupy the majority of the interior area 30 of door D. The depicted thermometers 20A-20D build a group of four thermometers measuring the interior temperature $\theta i$ in a high, higher mid, lower mid and low area of the door. A group of corresponding thermometers mounted on the outside of the heat exchanger may be configured for measuring the exterior temperature $\theta e$. As illustrated in FIG. 2, first and second flow meters 12 and 14 are installed in the cool water inflow line 24 and the return flow line 26 for measuring corresponding inflow and return flow rates. First and second thermometers 16 and 18 (not shown) may be mounted together with first and second flow meters 12 and 14, respectively, to measure both flow and line temperature.

The operator panel and display may be integrated into the exterior 32 of door D (not shown) such that the operating status of heat exchanger system 10 is visible from the outside. A simple user interface may enable the user to select between different display values. Because microprocessor 25 processing the sensor data may employ arbitrary calculations on the input, a wide range of information may be displayed including, but not limited to: inflow and return flow rates; flow line temperature; interior exhaust temperature and exterior exhaust temperature on specified vertical zones; heat quantity dissipated by the heat exchanger; and minimum, maximum, and average values as measured over a specified period of time.

As those skilled in the art will appreciate, providing microprocessor 25 with USB interface may permit simple integration with one or more systems in the monitored rack. This may provide one basic way to achieve remote access to the rear door's operating status and history data. However, using standard components, the microprocessor itself may be expanded with further networking capabilities such as ethernet, wireless LAN, CAN, and the like, which enable integration of heat exchanger system 10 into a broader site wide facility control system.

Figure 3A:
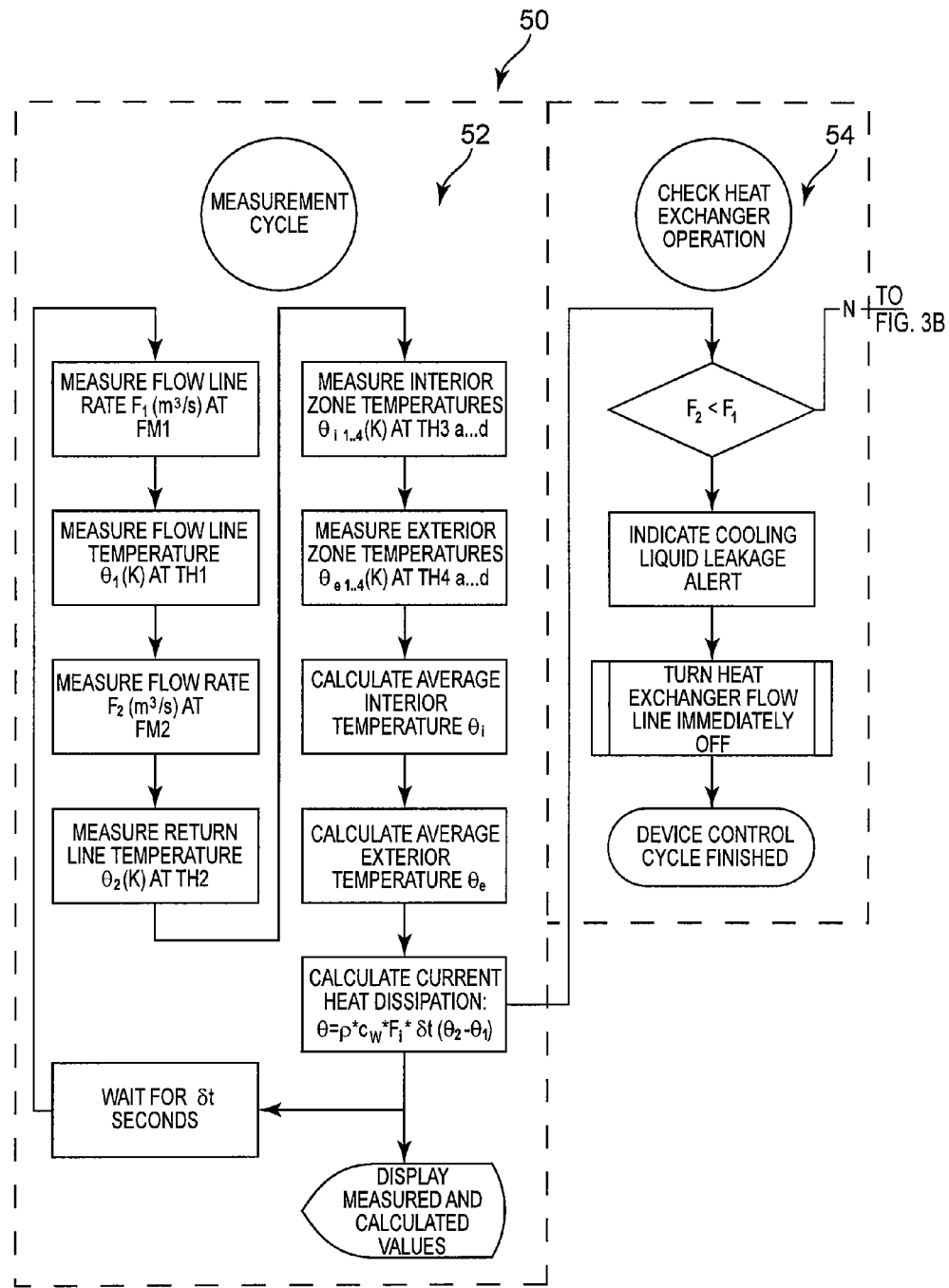
FIGS. 3A-3C form a flowchart illustrating an algorithm in accordance with the present invention for controlling operation of the rack mounted system and the heat exchanger system.
Figure 3B:
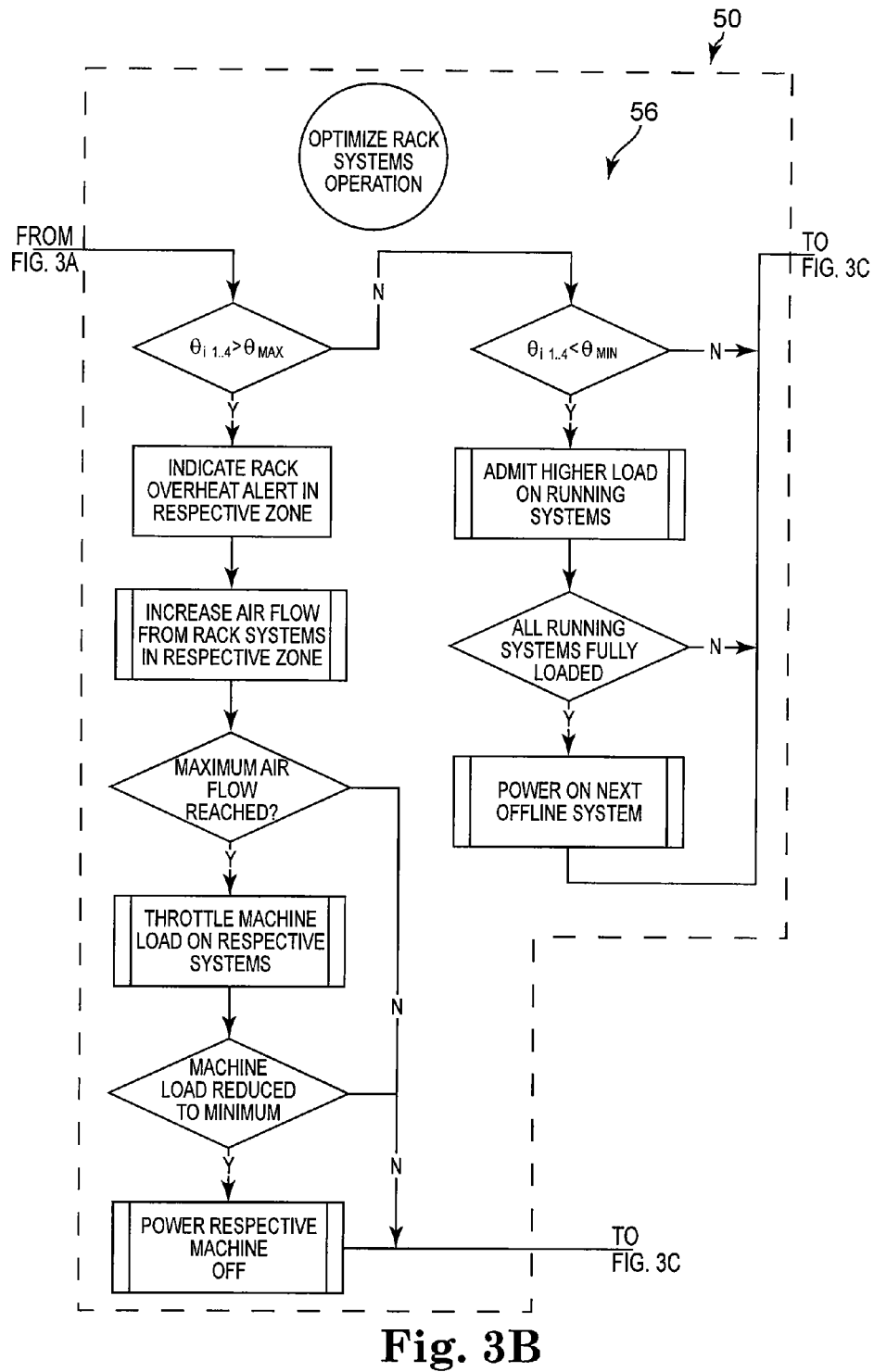
Figure 3C:
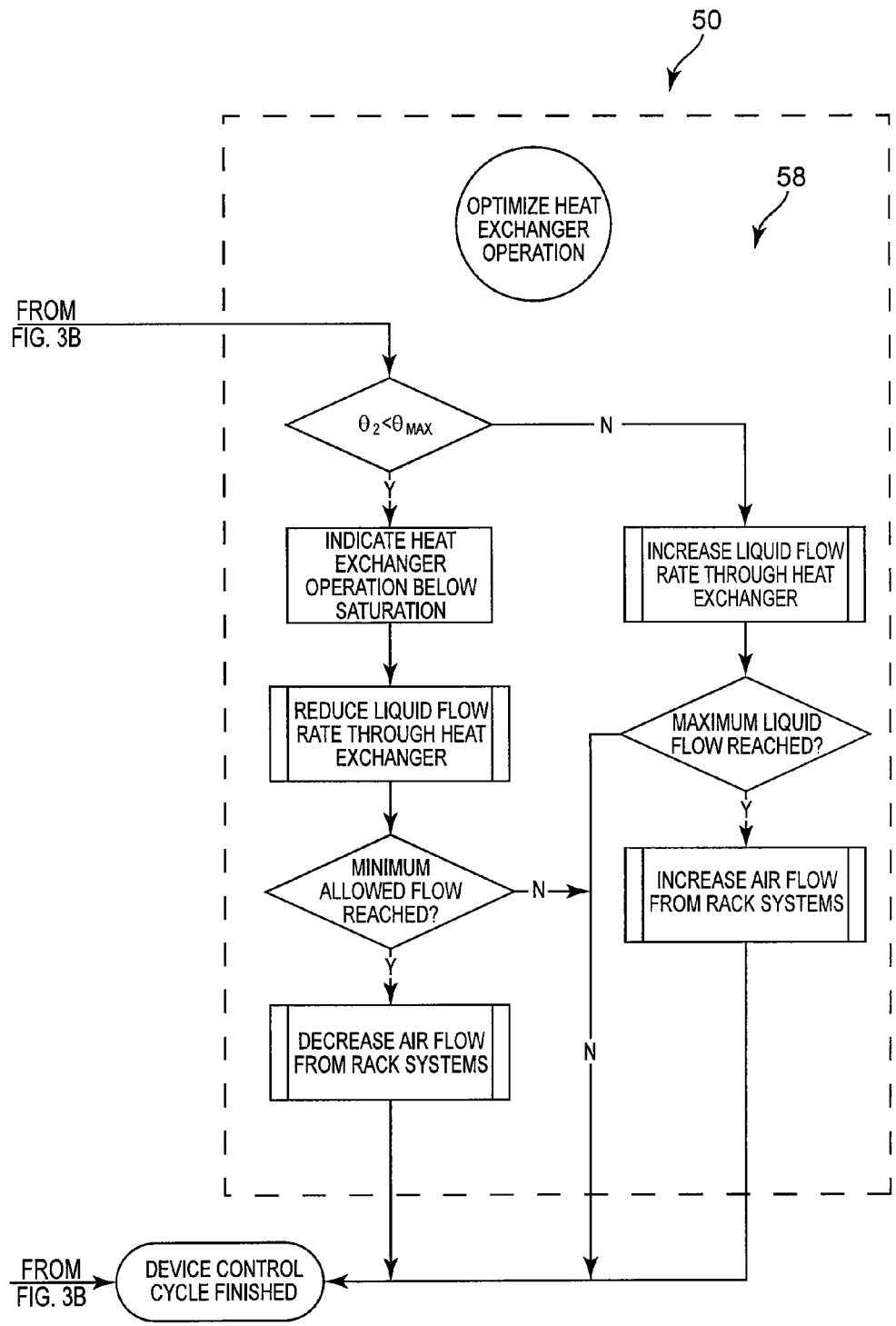

FIGS. 3A-3C form a flowchart illustrating an algorithm 50 executable by the microprocessor for controlling operation of the rack mounted systems as well as the heat exchanger system. The "optimizing" objective of the algorithm is to maximize the heat dissipation of the heat exchanger by regulating the cooling liquid flow through the heat exchanger and controlling the air flow through the rack system by adjustment of the blower capacity. As an extreme measure, overheating systems may be shut down.

In a first portion 52 of algorithm 50, measurements are taken with first flow meter 12 (first flow F1), second flow meter 14 (second flow F2), first thermometer 16 (first temperature $\theta1$), second thermometer 18 (second temperature $\theta2$), third thermometer 20 (third temperature $\theta3$), and fourth thermometer 22 (fourth temperature $\theta4$). In one exemplary embodiment, these values may be read, stored, and displayed during the measurement cycle, which may be executed at a fixed time interval $\delta t$. During the device control cycle, these measured values may thereafter be evaluated and appropriate actions taken with respect to the heat exchanger and rack mounted systems.

In a second portion 54 of algorithm 50, the microprocessor determines whether the flow rate in return flow line 26 measured with second flow meter 14 (F2) is less than the flow rate in inflow line 24 measured with first flow meter 12 (F1). If the microprocessor determines that the return flow line flow rate F2 is less than the inflow line flow rate F1, then the heat exchanger is leaking. In one exemplary embodiment, a visual indicator such as a blinking light mounted to the rear door complex may illustrate that a leak has occurred. As those skilled in the art will appreciate, other types of alerts are contemplated and within the intended scope of the present invention such as, for example, audible warnings or alerts detectable by one of the other senses. Once the leakage alert has been emitted, the transport medium flow into the heat exchanger may be immediately turned off, and control of the heat exchanger system for that control cycle is complete.

In a third portion 56 of algorithm 50, the microprocessor monitors whether the interior temperature in one of the vertical zones (e.g., the zones illustrated in FIG. 2) exceeds an adjustable maximum value $\theta max$ that is configurable by the user. As soon as the interior temperature in one of the vertical zones rises over the maximum value θmax, a zone overheating alert may be triggered. Thereafter, measures may be taken, such as in an escalating manner, to decrease the heat produced by the systems in the appropriate thermal zone. For example, the local system blowers or equivalent cooling systems may be stepwise brought to their maximum cooling power. Then, the computing capabilities of the system may be throttled, such as in a stepwise manner. If for any reason these actions do not successfully reduce the heat load within the rack, the systems may be shut down.

Alternatively, if the temperature falls below an adjustable minimum value θmin, a reverse process may be executed. For example, the processing load for the systems currently running may become unlimited. Furthermore, the systems that were powered down during the escalation phase may be successively powered on once again.

In a fourth portion 58 of algorithm 50, the microprocessor may optimize the operation of the heat exchanger system by controlling the flow of the heat transport medium through the heat exchanger in combination with control of the overall heat flow produced by the systems in the rack. In particular, during those periods of time when no zone overheating is currently detected, the objective is to maximize the temperature difference between the inflow line and the return flow line. Because there is no way to influence the temperature of the heat transport medium in the inflow line, the maximized temperature difference between the inflow line and the return flow line depends directly upon the temperature of the heat transport medium in the return flow line. Thus, a maximum value of the heat transport medium in the return flow line may be predefined based upon the HVAC operating parameters which define flow line and return flow temperature, and the algorithm of the present invention may operate to bring the return flow temperature of the heat transport medium as close as possible to the predefined maximum value. Stated in other terms, this process is equivalent to maximizing the heat quantity produced by the heat exchanger.

As illustrated in FIG. 3C, the optimization may utilize two phases until the temperature of the heat transport medium in the return flow line reaches the predefined maximum value. First, the flow of the heat transport medium through the heat exchanger may be reduced to a minimum allowable value, which may also be a configurable parameter. If this action alone is not sufficient to maximize the heat quantity produced by the heat exchanger, the rack system blowers may be slowed down to their minimum output speed, which may once again be a configurable parameter. Such actions will function to increase the temperature at the rack interior, thereby also increasing the temperature of the heat transport medium in the return flow line. As a result, the heat load within the rack increases, while the heat dissipation of the heat exchanger decreases.

If the heat exchanger becomes oversaturated (i.e., the temperature of the heat transport medium in the return flow line is greater than the predefined maximum value), the flow rate of the heat transport medium may be increased. Additionally, the speed of the rack system blowers may also be accelerated. This may lead to decreased heat load within the rack along with increased heat dissipation by the heat exchanger.

As those skilled in the art will appreciate, algorithm 50 is merely one example of an algorithm for controlling operation of a heat exchanger system in accordance with the present invention. Thus, the number and order of steps by may modified without departing from the intended scope of the present invention. Furthermore, heat exchanger system 10 represents only one exemplary embodiment of a heat exchanger system that may be utilized in conjunction with and controlled by algorithm 50.

Although the present invention has been described with reference to preferred embodiments, workers skilled in the art will recognize that changes may be made in form and detail without departing from the spirit and scope of the invention.

What is claimed is:

1. A method for controlling operation of a heat exchanger system comprising:
    providing a heat exchanger system mountable to a rear door of a rack mounted computer system, the heat exchanger system comprising:
        an inflow line;
        a first flow meter structured for measuring a first flow rate in the inflow line;
        a first temperature sensor structured for measuring a first temperature in the inflow line;
        a return flow line;
        a second flow meter structured for measuring a second flow rate in the return flow line;
        a second temperature sensor structured for measuring a second temperature in the return flow line; and
        a heat exchanger disposed between the inflow line and the return flow line;
    circulating a heat transport medium through the heat exchanger system;
    detecting leaks in the heat exchanger system by comparing the first flow rate in the inflow line to the second flow rate in the return flow line;
    emitting a leakage alert and ceasing further circulation of the heat transport medium through the heat exchanger system when the first flow rate exceeds the second flow rate by a predetermined flow amount;
    optimizing operation of the rack mounted computer system by monitoring an interior temperature of the rack mounted computer system in a plurality of vertical zones, wherein optimizing operation of the rack mounted computer system includes:
        emitting a rack overheat alert and automatically increasing air flow through the heat exchanger system when the interior temperature in at least one of the vertical zones exceeds a maximum desirable interior temperature value; and
        automatically increasing a load level of the rack mounted computer system when the interior temperature in at least one of the vertical zones is less than a minimum desirable interior temperature value;
    optimizing operation of the heat exchanger system by comparing the second temperature measured by the second temperature sensor with a predetermined maximum return flow temperature value, wherein optimizing operation of the heat exchanger system includes:
        automatically reducing flow of the heat transport medium through the heat exchanger and decreasing air flow from through the heat exchanger system when the second temperature is less than the predetermined maximum return flow temperature value; and
        automatically increasing flow of the heat transport medium through the heat exchanger and increasing air flow through the heat exchanger system when the second temperature is greater than or equal to the predetermined maximum return flow temperature value.

* * * * *